United States Patent [19]

Piorunneck et al.

[11] Patent Number: 4,934,961

[45] Date of Patent: Jun. 19, 1990

[54] BI-LEVEL CARD EDGE CONNECTOR AND METHOD OF MAKING THE SAME

[75] Inventors: Heinz Piorunneck, Trumbull; Donald S. Eisenberg, Weston, both of Conn.

[73] Assignee: Burndy Corporation, Norwalk, Conn.

[21] Appl. No.: 287,765

[22] Filed: Dec. 21, 1988

[51] Int. Cl.[5] .......... H05K 1/00

[52] U.S. Cl. .......... 439/637; 439/65; 439/751; 439/59

[58] Field of Search .......... 439/629-637, 439/55, 59-62, 885, 886, 741, 751, 65

[56] References Cited

U.S. PATENT DOCUMENTS

| | | | |
|---|---|---|---|
| Re. 29,223 | 5/1977 | Pritulsky | 339/75 |
| 2,699,527 | 1/1955 | Kamowski | 324/19 |
| 3,022,481 | 2/1962 | Stepoway | 339/75 |
| 3,130,351 | 4/1964 | Giel | 317/101 |
| 3,172,718 | 3/1965 | Lalonde | 339/176 |
| 3,173,737 | 3/1965 | Kinkaid et al. | 339/176 |
| 3,283,291 | 11/1966 | Krol et al. | 339/276 |
| 3,289,148 | 11/1966 | Antes | 439/637 |
| 3,399,372 | 8/1968 | Uberbacher | 339/17 |
| 3,417,362 | 6/1967 | Reynolds | 339/17 |
| 3,464,054 | 8/1969 | Mansfield | 439/637 |
| 3,504,330 | 3/1970 | Holzhaeuser | 339/176 |
| 3,518,610 | 6/1970 | Goodman et al. | 339/17 |
| 3,526,869 | 9/1970 | Conrad et al. | 339/75 |
| 3,530,422 | 9/1970 | Goodman | 339/17 |
| 3,553,630 | 1/1971 | Scheingold et al. | 339/74 |
| 3,665,375 | 6/1972 | Thoms et al. | 339/192 |
| 3,673,548 | 6/1972 | Mattingly, Jr. et al. | 339/186 |
| 3,683,317 | 8/1972 | Walkup | 339/75 |
| 3,737,838 | 6/1973 | Mattingly, Jr. et al. | 339/186 M |
| 3,742,430 | 6/1973 | Cairns et al. | 339/252 |
| 3,797,108 | 3/1974 | Healy et al. | 29/630 |
| 3,866,999 | 2/1975 | Doherty, Jr. | 339/17 CF |
| 3,868,166 | 2/1975 | Ammon | 339/176 |
| 3,899,234 | 8/1975 | Yeager et al. | 339/74 |
| 3,975,076 | 8/1976 | Shida et al. | 339/17 L |
| 3,989,344 | 11/1976 | Rechard et al. | 439/637 |
| 4,045,114 | 8/1977 | Dechelette | 339/210 |
| 4,045,868 | 9/1977 | Ammon et al. | 29/629 |
| 4,047,782 | 9/1977 | Yeager | 339/75 |
| 4,077,694 | 3/1978 | Cobaugh et al. | 339/176 |
| 4,095,866 | 6/1978 | Merrill | 339/17 |
| 4,106,841 | 8/1978 | Vladic | 439/637 |
| 4,133,592 | 1/1979 | Cobaugh et al. | 339/17 M |

(List continued on next page.)

FOREIGN PATENT DOCUMENTS

| | | |
|---|---|---|
| 41253 | 1/1970 | Australia . |
| 961560 | 1/1975 | Canada . |
| 0058578 | 8/1982 | European Pat. Off. . |
| 2431914 | 1/1975 | Fed. Rep. of Germany . |
| 1048062 | 11/1966 | United Kingdom . |
| 2022329 | 12/1979 | United Kingdom . |
| 2028015 | 2/1980 | United Kingdom . |

OTHER PUBLICATIONS

8181 New Electronics, vol. 17 (1984) Jan., No. 2, London, Great Britain, "Designing a Connector for Backplanes of the Future", M. J. Reynolds.

"Coaxial Cable to Printed Circuit Board Connector", vol. 13, No. 6, November, 1970, one page, R. L. Agard, L. E. Brearley and S. M. Jensen.

IBM Tech. Disclosure Bulletin, "Contractor Expansion of Electrical Connectors", vol. 30, #8, Jan., 1988, pp. 217-218.

*Primary Examiner*—David Pirlot

*Attorney, Agent, or Firm*—Perman & Green

[57] ABSTRACT

A bi-level connector for making mechanical and electrical contact between a mother printed circuit board and a daughter printed circuit board. The connector comprises lower level contacts with a varied spring rate when a daughter printed circuit board is inserted. The method of manufacturing the connector comprises forming a strip of two types of contacts, upper contacts and lower contacts, on a single carry strip in alternating fashion such that both the upper and lower contacts can be simultaneously inserted into a connector housing in a single insertion process.

22 Claims, 5 Drawing Sheets

U.S. PATENT DOCUMENTS

| | | | |
|---|---|---|---|
| 4,159,861 | 7/1979 | Anhalt | 339/75 |
| 4,165,909 | 8/1979 | Yeager et al. | 339/75 |
| 4,166,667 | 9/1979 | Griffin | 339/176 |
| 4,179,177 | 12/1979 | Lapraik | 339/74 |
| 4,184,735 | 1/1980 | Ammon et al. | 339/217 |
| 4,226,496 | 10/1980 | Langham | 439/637 |
| 4,298,237 | 11/1981 | Griffith et al. | 339/17 |
| 4,303,294 | 12/1981 | Hamsher, Jr. et al. | 339/74 |
| 4,343,523 | 8/1982 | Cairns et al. | 339/59 |
| 4,403,819 | 9/1983 | Weber | 339/75 |
| 4,431,252 | 2/1984 | Cairns et al. | 339/176 |
| 4,487,468 | 12/1984 | Fedder et al. | 339/75 |
| 4,546,542 | 10/1985 | Proud . | |
| 4,561,712 | 12/1985 | Borne et al. | 339/33 |
| 4,645,279 | 2/1987 | Grabbe et al. | 339/17 |
| 4,684,194 | 8/1987 | Jenkins et al. | 439/260 |
| 4,705,338 | 11/1987 | Sitzler | 439/260 |
| 4,720,156 | 1/1988 | Beers | 439/260 |
| 4,806,103 | 2/1989 | Kniese et al. | 439/60 |
| 4,846,734 | 7/1989 | Lytle | 439/637 |
| 4,869,671 | 9/1989 | Andrews Jr. | 439/60 |

BI-LEVEL CARD EDGE CONNECTOR AND METHOD OF MAKING THE SAME

BACKGROUND OF THE INVENTION

1. Field of the Invention

This invention relates to electrical connectors and, more particularly, to bi-level card edge connectors and a method of fabricating an electrical contact strip having alternating first and second types of contacts for use in a bi-level connector.

2. Prior Art

In the electrical arts it is a common practice to use a connector to mechanically and electrically couple a mother printed circuit board with a daughter printed circuit board as of the vertical edge card variety. In such a practice, there has been an evolution towards placing electrical contacts closer and closer together while maintaining a high, constant stress between the electrical contacts and the areas to be contacted. In placing the contacts closer together, as to 20 contacts per linear inch, the width of each contact must decrease. This, in turn, makes it much more difficult to keep the proper contact stress between the contact and the areas to be contacted while also assuring proper alignment between the two upon insertion of the edge card into the connector. One approach in the past was to apply a spherical dimple stamped into the contact. A further approach is disclosed in co-pending U.S patent application Ser. No. 07/146,858 filed Jan. 22, 1988 entitled "Vertical Edge Card Connectors" by Thomas G. Lytle which is assigned to the same assigned as herein and is incorporated by reference in its entirety herein.

There has also been developed a special type of connector which is known in the art as a bi-level connector; i.e.: a connector having two types of contacts that make contact with a daughter printed circuit board in two locations or at two levels. The two types of contacts are generally intermixed or alternatingly arranged in two opposing rows. The first type of contacts are arranged at a predetermined pitch, such as 100 mils, between the first type of contacts. The second type of contacts are also arranged at a predetermined pitch, such as 100 mils, between the second type of contacts such that there is a 50 mils pitch between adjacent first and second contacts.

The high density card edge connector in the past encountered a problem in regard to the amount of force that was necessary to insert the edge of the daughter printed circuit board into the connector because each contact is a spring contact and it must be at least partially moved by the card edge and because there are more contacts in the high density connectors. The bi-level connector alleviated this problem to a degree by allowing for a two step engagement of the card edge with the contacts; the first step being the displacement of the upper first type of contacts and the second step being the displacement of the lower second type of contacts. However, a problem still exists when inserting a card edge into the second rows of lower contacts because, in addition to the force required to displace the lower second type of contacts, the card edge is already making contact with the first rows of upper contacts, usually at a very high stress such as about 150,000 psi per contact. An operator when inserting the daughter printed circuit board into a connector may, in attempting to overcome the high density spring forces of the contacts, damage the circuit board or connector.

Another problem that has arisen with the bi-level connectors is the fact that, in the past, the two types of contacts were manufactured separately and thus had to be inserted into the connector housing at separate operations. This requires more time, equipment and expense than a single insertion operation.

As illustrated by a great number of prior patents as well as commercial devices, efforts are continuously being made in an attempt to improve connectors and their contacts to render them more efficient, effective and economical. None of these previous efforts, however, provides the benefits attendant with the present invention. Additionally, prior connectors and contacts do not suggest the present inventive combination of method steps and component elements arranged and configured as disclosed and claimed herein. The present invention achieves its intended purposes, objects and advantages over the prior art devices through a new, useful and unobvious combination of method steps and component elements, with the use of a negligible number of functioning parts, at a reasonable cost to manufacture, and by employing only readily available materials.

It is therefore an object of the present invention to provide an electrical contact for use in a connector adapted to be attached to a mother printed circuit board and adapted to removably receive a daughter printed circuit board of the edge card type for mechanically and electrically coupling the mother and daughter printed circuit boards, the connector being of the type formed of an electrically insulating housing with a plurality of electrically conductive contacts extending therethrough for removably receiving the daughter printed circuit board, the contacts comprising two types of contacts alternatingly arranged with the second type of contacts having a variable spring rate for varying the amount of force required to displace the second type of contacts by a daughter printed circuit board.

It is a further object of the invention to provide a method of fabricating an electrical contact strip comprising alternatingly arranged first and second types of contacts.

It is a further object of the invention to provide a method of making an electrical connector with two types of contacts alternatingly arranged on a contact strip that can be simultaneously inserted into a connector housing.

It is yet a further object of this invention to miniaturize electrical connectors and their contacts.

Still a further object of the invention is to maintain a high, constant stress between electrical contacts of connectors and the contacted electrical components.

The foregoing has outlined some of the more pertinent objects of the invention. These objects should be construed to be merely illustrative of some of the more prominent features and applications of the intended invention. Many other beneficial results can be attained by applying the disclosed invention in a different manner or modifying the invention within the scope of the disclosure or prior art. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The foregoing problems are overcome and other advantages are provided by a bi-level card edge connector having variable spring rate lower contacts and an improved method of inserting contacts into a bi-level connector housing.

In accordance with one embodiment of the invention, an electrical connector for mechanically and electrically connecting a mother printed circuit board and a removable daughter printed circuit board of the card edge type is provided. The connector generally comprises housing means, first contact means and second contact means. The second contact means comprises a first portion formed as a solder tail positionable to extend from the housing for coupling with a mother printed circuit board, a second portion extending into the housing means from the first portion and having an angled portion therewith, a third portion comprising a first bight with an outer face on a first side of the second type of contact, and a fourth portion extending from the third portion and forming a second bight with an outer face on the first side of the second type of contact for contacting and supporting a received daughter printed circuit board.

In accordance with another embodiment of the invention, an electrical connector for mechanically and electrically connecting a mother printed circuit board and a removable daughter printed circuit board of the edge card type is provided. The connector generally comprises housing means of an electrically insulating material, the housing means having at least two rows of separate contact housing chambers, each of the housing chambers having a rear wall and an opposite contact aperture communicating with a central aperture of the housing for receiving a daughter printed circuit board; and contact means comprising a plurality of a first type of electrically conductive contacts, each of the first type of contacts comprising a first portion formed as a solder tail positionable to extend from the housing for coupling with a mother printed circuit board, a contacting portion for contacting a daughter printed circuit board, the contacting portion being partially displaceable from a home position by the insertion of a daughter printed circuit board into the connector, and means for varying the amount of force necessary to displace the contacting portion during insertion of the daughter printed circuit board into the connector at a predetermined position during the insertion.

In accordance with one method of the invention, a method of fabricating an electrical contact strip is provided comprising the steps of providing an elongate strip of electrically conductive material and stamping the strip to substantially simultaneously produce a series of contacts connected at their lower portions by a carry strip, the series of contacts comprising alternating first and second types of contacts, the first type of contacts having a first length and shape and the second type of contact having a different second length and shape whereby both the first and second types of contacts can be inserted into a connector housing in their alternating orientations with one insertion operation.

In accordance with another method of the invention, a method of fabricating an electrical connector is provided comprising the steps of providing a housing having at least two rows of a plurality of contact chambers for individually and separately housing individual contacts, providing a strip of electrical contacts, the strip comprising a carry strip having a plurality of contacts connected thereto, the contacts comprising a first type of contact and a second type of contact, the first and second types of contacts each having a contact portion for contacting a component to be electrically coupled with the contacts, the contact portions of the first type of contacts being located at a first distance from the carry strip and the contact portions of the second type of contacts being located at a second distance from the carry strip, the first and second types of contacts being alternatingly arranged on the carry strip; inserting the contacts into the housing contact chambers and securing them therein; and removing the carry strip from the contacts.

BRIEF DESCRIPTION OF THE DRAWINGS

For a fuller understanding of the nature and objects of the invention, reference should be had to the following detailed description taken in conjunction with the accompanying drawings in which.

DETAILED DESCRIPTION OF THE INVENTION

Figure 7:
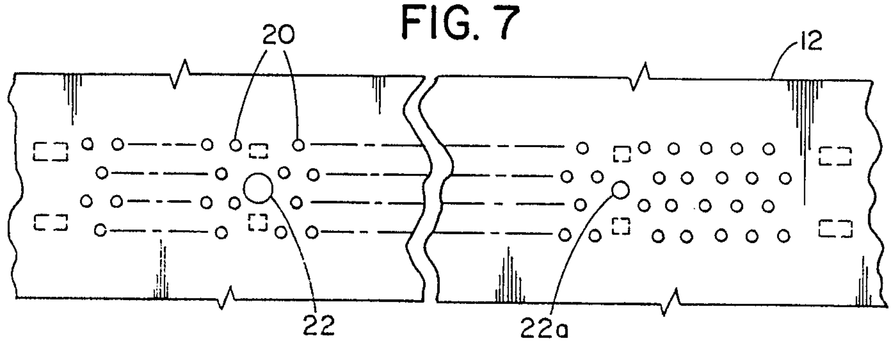
FIG. 7 is a plan view of a portion of the mother printed circuit board to which the connector of the present invention may be coupled.
Figure 8A:
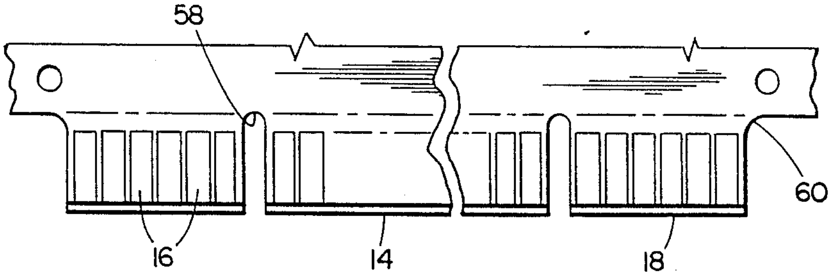
FIG. 8A is a front elevational view of a portion of a daughter printed circuit board of the old edge card type adapted to be received by the connector of the present invention.
Figure 8B:
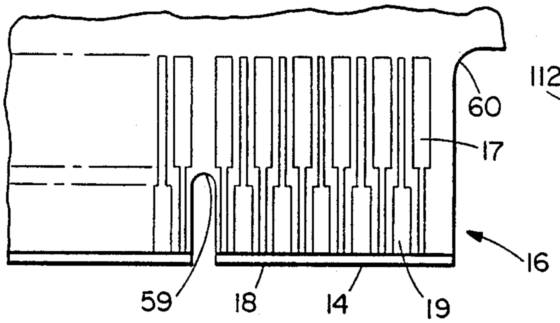
FIG. 8B is a front elevational view of a portion of a daughter printed circuit board of the new high density edge card type adapted to be received by the connector of the present invention.

Shown in the various Figures is an edge card connector 10 adapted to couple a mother printed circuit board 12 with a daughter printed circuit board 14 of the edge card type. Board 14 has contact traces 16 along one edge 18. A portion of a typical mother printed circuit board is shown in FIG. 7 while a typical edge card type daughter printed circuit board can generally have two forms. The first form, as shown in FIG. 8A, is also known as the older type of circuit board with uniform contact strips 16 set at a uniform pitch of about 100 mils. The second form, as shown in FIG. 8B, is also known as the newer high density type of circuit board with two different types of contact strips; upper contact strips 17 and lower contact strips 19. The upper and lower contact strips 17 and 19 are set at a uniform pitch of about 50 mils. For the sake of illustration only, the mother printed circuit board is shown with apertures 20 at the ends of its electrical traces for receiving the coupled electrical element such as the connector of the present invention. Enlarged apertures 22 and **22*a* are also included for mechanically attaching the connector 10 with the board 12. It should be understood, however, that a surface mount connection with soldering could be utilized for the coupling between connector and board. A portion of the daughter printed circuit board 14 is illustrated in FIG. 8A with aligned parallel contacts 16 shown. This is that portion of the daughter board adapted to be releasably coupled with the connector 10 of the instant invention whereby the individual traces 16 may be coupled with the individual contacts of the connector for coupling the mother and daughter printed circuit boards 12 and 14**.

The connector 10 is comprised of two basic components, an electrically insulating housing 26 and a plurality of two types of electrically conductive contacts 28 and 29. The contacts function to transmit electrical current, either signals or power, between the upper edge 30 adjacent to the daughter board and the lower edge 32 adjacent to the mother board. The housing 26 provides support between the electrical components 15 being coupled and supports the individual contacts 28 and 29 in the proper electrically isolated position, with respect to each other. The first type of contacts 28 are upper level contacts intended to be able to make contact with the contact traces 16 of either the lower type of circuit board as shown in FIG. 8A or the upper contact traces 17 of the high density type of circuit board as shown in FIG. 8B. In the embodiment shown, the upper level of contacts 28 are set at a 50 mil pitch with the second type of contacts 29. The second type of contacts 29 are lower level contacts intended to be able to make contact with the lower contact traces 19 of the high density type of circuit board shown in FIG. 8B, but not intended to make contact with the contact traces 16 of the older type normal density circuit board shown in FIG. 8A.

Figure 1A:
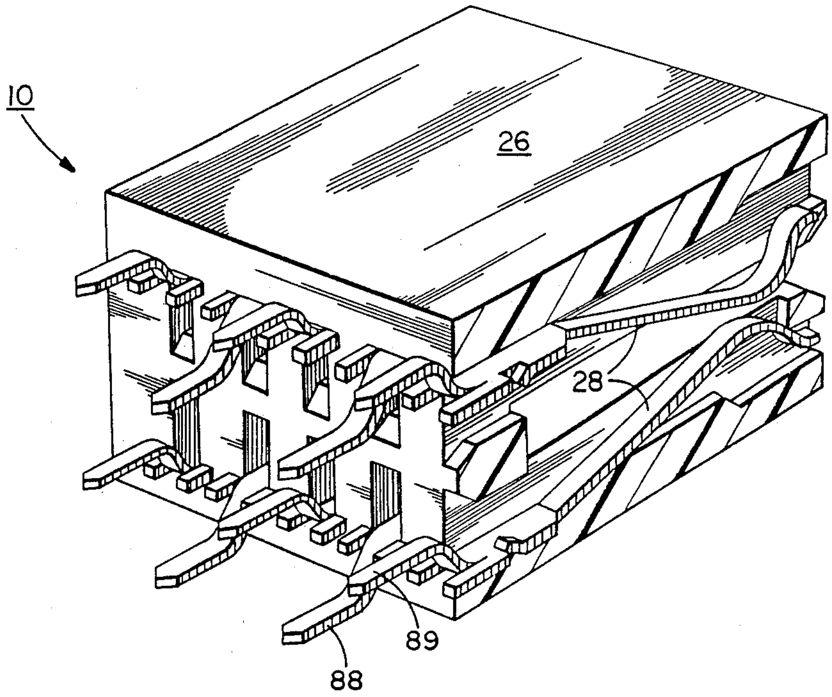
FIG. 1A is an enlarged partial perspective illustration of a connector constructed in accordance with the present invention with parts removed to show certain internal constructions thereof.
Figure 1B:
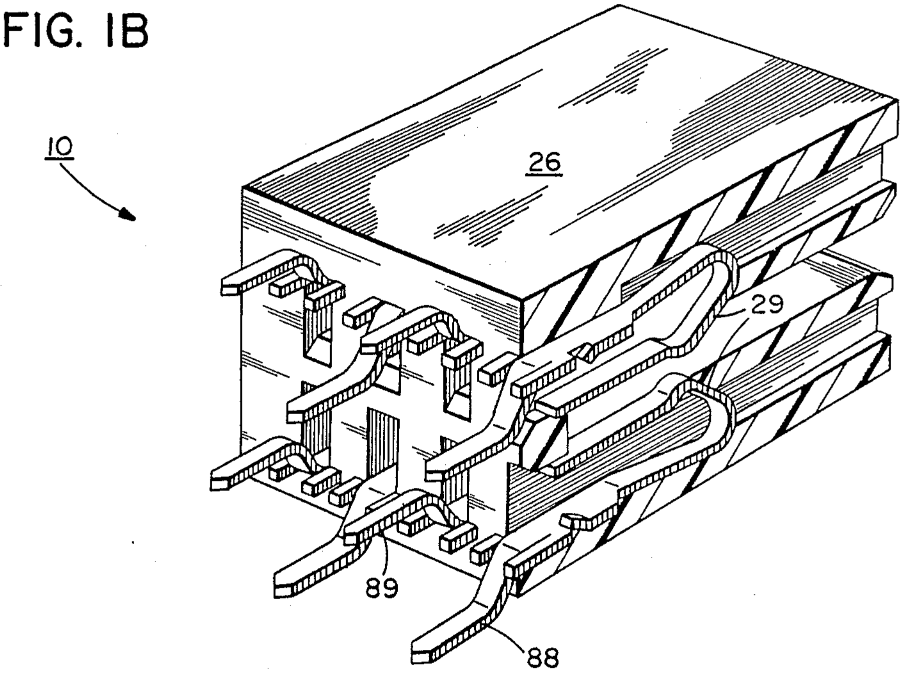
FIG. 1B is an enlarged partial perspective illustration of the connector shown in FIG. 1A with parts removed to show certain other internal constructions thereof.
Figure 2:
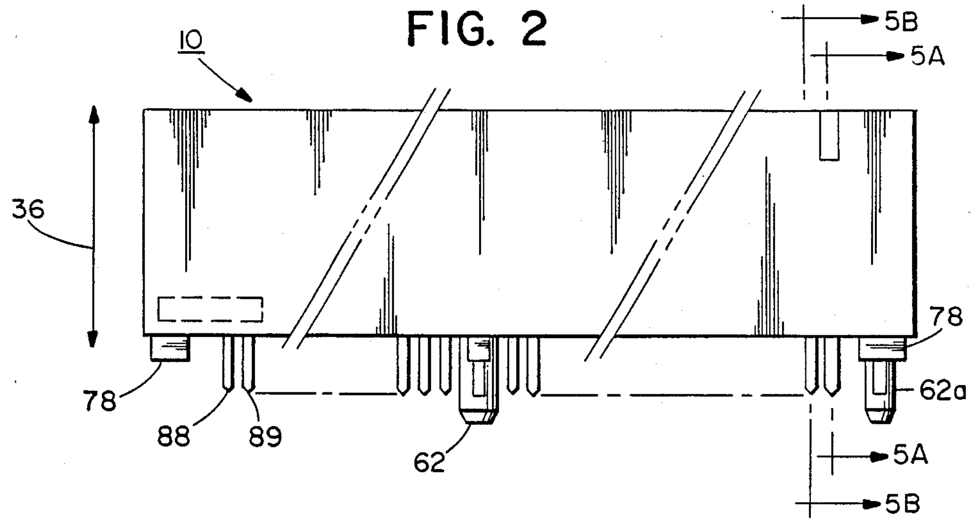
FIG. 2 is a front elevational view of the connector shown in FIG. 1.

The housing 26 is a generally rectangular member molded of a conventional electrical insulator such as Ryton R-4, Ryton R-7, or Ryton R-404. Ryton is a trademark of the Phillips 66 Company of Pasadena, Tex. The housing 26 is of an extended length 34 largely determined by the number of contacts to be supported and has a height 36, through the majority of its extent, slightly less than the lengths of the supported contacts. Its thickness 38 is relatively thin, being merely sufficient to retain the two rows of opposed contacts with a space 42 therebetween for receiving the daughter board 14 (note the cross-sectional configuration of FIGS. 5A and 5B). The majority of the bulk of each housing 26 is comprised of essentially parallel side walls 46 extending the entire length of the housing and connector. End walls 48, formed integrally at the ends of the side walls, couple the side walls 46 and are of sufficient thickness to add rigidity to the housing. One or more intermediate walls 50 may be spaced periodically along the length of the side walls parallel with the end walls for further rigidity. The side walls 46 and intermediate walls 50 have upper edges 54 and 56 while the daughter printed circuit board 14 has recesses 58 and 60. The asymmetric location of the intermediate wall 50 and intermediate cutout 58 precludes the improper locating of the daughter printed circuit board into the housing. The space 42 is intended to receive the edge of the daughter printed circuit board 14 and for this purpose is substantially open with the exception of portions of the projecting contacts 28 and 29, intermediate walls 50 and keying projections 51 (see FIG. 5A). In an alternate embodiment of the invention, the keying projections 51 may be provided as separating or barrier walls with corresponding slots on the daughter printed circuit board as described below. The keying projections 51 are strategically located at a select and limited number of locations and are intended to make mating engagement with a keying slot 59 (see FIG. 8B) in the high density type of circuit boards. The older type of circuit boards shown in FIG. 8A do not have a keying slot to accommodate the keying projections 51. Therefore, when an older type of circuit board is inserted into the connector 10 the keying projections prevent the leading edge 18 from being inserted into the lower contacts 29, but merely allows the older type of circuit board to be inserted and make contact with the upper contacts 28 and stops the leading edge from further advancement into the connector 10. This prevents a relatively wide contact trace 16 on the older type of circuit board from contacting both an upper and lower contact 28 and 29, which are relatively close to each other, thereby preventing crossover or a short circuit. Thus, the high density bi-level connector of the present invention can be used with both the normal density edge card circuit boards and the high density edge card circuit boards. Depending projections or posts 62 and **62*a* extent downwardly from the intermediate and end walls for providing a mechanical coupling with the mother circuit board. The posts may be provided with different characteristics for proper orientation with the circuit board. For instance, the diameters of posts 62 and 62*a* can be different, as shown in FIG. 2, to provide proper orientation to the circuit board. Also, the shape of posts 62 and 62*a*** can be different for the same purpose.

A pair of parallel upper bearing strips or shelves 64 extend from end wall to end wall of the housing. Spacer bars 66 are periodically located between the shelves 64 and their associated side walls 46 to define apertures 68 for receiving the upper edge portions of the individual contacts 28 and 29. The upper interior edges of the support bars are beveled for guiding the lower edge of a daughter printed circuit board into the slot. The lower face of the housing is also provided with a longitudinal support bar 72 and spacer bars 74 defining apertures 76 for separating the lower edges of the individual contacts.

Standoffs 78 are formed into the lower face of the connector housing to maintain the housing a predetermined distance from the mother printed circuit board for functioning as a washway to allow the flow of fluid therefrom as is necessary during the soldering of the solder tails to the mother printed circuit board.

Figure 5A:
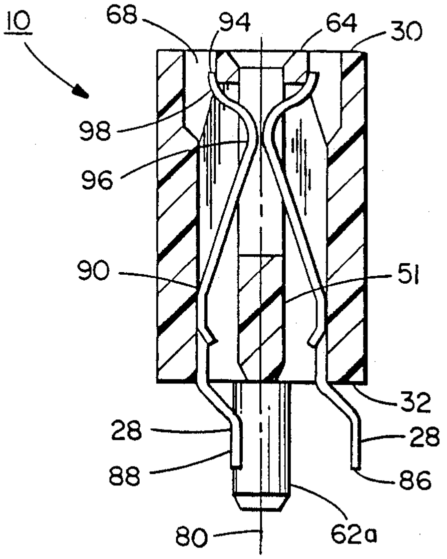
FIG. 5A is a sectional view of the connector shown in FIG. 2 taken along line 5A—5A.
Figure 5B:
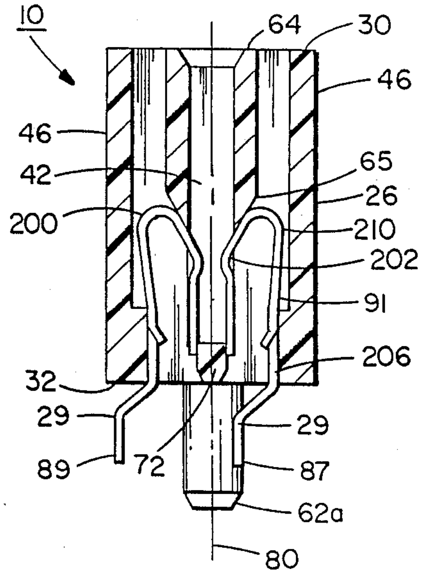
FIG. 5B is a sectional view of the connector shown in FIG. 2 taken along line 5B—5B.
Figure 6:
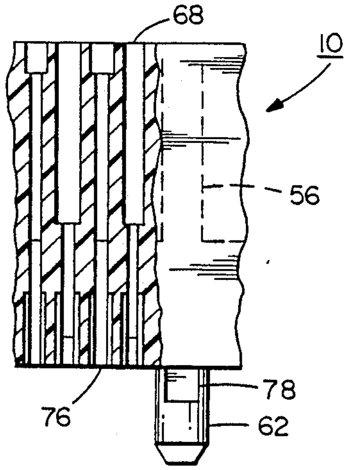
FIG. 6 is a partially fragmented view of a portion of the connector housing shown in FIG. 2.

A vertical central plane 80, shown in FIGS. 5A and 5B, separates the connector including the housing and the rows of contacts into two essentially symmetric halves. Further, the use of a vertical central plane and the illustration of an upstanding connector and daughter printed circuit board in combination with a horizontal mother circuit board are done for descriptive purposes only. It should be understood that the present invention could be practiced at virtually any angular, planar orientation with respect to the horizontal or vertical.

Supported within the housing are a plurality of individual electrical contacts 28 and 29. The contacts are arranged in two essentially parallel rows 82 and 84 generally symmetric about the vertical central plane 80. The lower ends 86 and 87 of each opposed pair terminate in solder tails 88 and 89. In the embodiment shown, the solder tails 88 of the upper contacts 28 are offset from the solder tails 89 of each adjacent pair of lower contacts 29. The solder tails 89 are adapted to be coupled with the electrical traces of the mother printed circuit board through apertures 20. As shown in FIG. 7, the through-hole technique is disclosed herein. It should be appreciated, however, that surface mount couplings could just as easily have been utilized.

Figure 3:
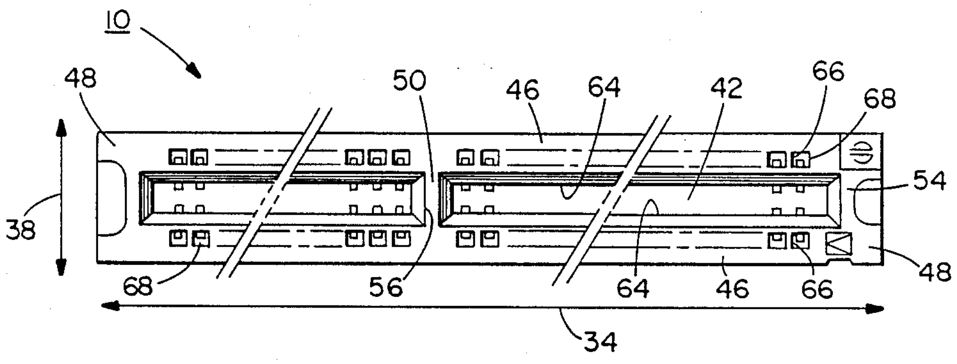
FIG. 3 is a top plan view of the connector shown in FIG. 2.
Figure 4:
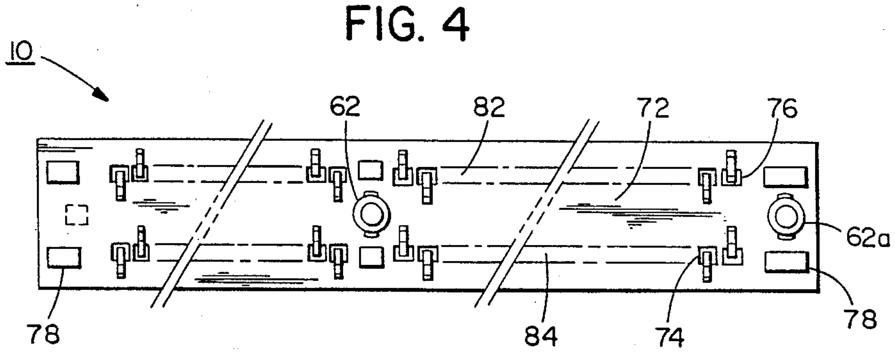
FIG. 4 is a bottom view of the connector shown in FIG. 2.

The solder tails 88 of the upper contacts extend upwardly into the housing (see FIG. 5A) where they have angled intermediate sections 90 bending toward the central plane 80 and then outwardly therefrom. At the area where the terminals bend inwardly then outwardly, there is a contact area or section 96 constituting a bight in the connector for making mechanical as well as electrical contact with the traces 16 of the daughter printed circuit board 14. Above this region, the contacts extend upwardly where the uppermost parts 98 are received in their individual apertures 68 defined by the side walls 46, shelves 64 and spacer bars 66, as shown in FIG. 3. The individual upper contacts 28 at their upper ends 94 are constrained from lateral movement by the spacer bars 66. The spacer bars 66 limit the degree of lateral movement of the upper ends of the contacts as during the insertion of the daughter printed circuit board cards into the connector as well as during their removal therefrom. The individual contacts are effectively spring loaded within the housing against the shelves 64 limiting the movement of adjacent contacts of each pair toward each other.

Figure 11:
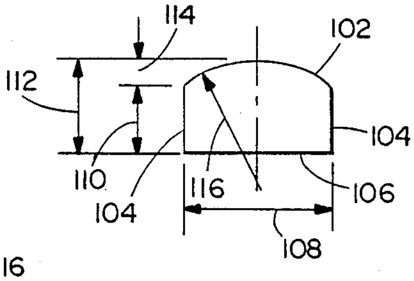
FIG. 11 is a sectional view of the contact shown in FIGS. 9 and 10 taken through the coined area.

The proper contact stress is thus provided by a combination of a crown on the contact area with a radius of curvature similar to that shown in FIG. 11 and the curve on the contact area with a radius of curvature as seen in FIG. 5A, the area where the traces 16 rest when inserted. The crown is formed by coining and bending the contact strips in the contact area. The radius then has a plating placed on it such as a gold. The crown and the radius jointly provide a combination of two radii which produce the proper stress when the contact is placed on the traces 16 of the daughter printed circuit board 14. The gold is used on the contact primarily for lubrication.

The upper contacts 28 are placed in the housing 26 and assume a free state. The contacts 28 are then placed in their confining apertures 68 as shown in FIG. 5A whereby they are pre-stressed by hooking behind the shelves 64. The contacts 28 then are further stressed when the daughter printed circuit board 14 is inserted so that their upper ends 94 move off the shelves thereby placing the proper amount of stress of about 150,000 psi, plus or minus 50,000 psi, on the traces 16 of the printed circuit board. Tests have shown that the daughter printed circuit board may be inserted and removed a hundred times without degrading performance of the contact, that is, the contact resistance will not degrade more than 10 millihoms over the hundred insertions and removals. When the printed circuit board 14 is inserted, deformation occurs on the upper contact 28 and traces to produce the proper contact. The modulus of elasticity and the positions ratio are considered when calculating the proper stress. In this case, the modulus of elasticity is about 16 million psi and the poisons ratio is about 0.3.

The solder tails 89 of the lower contacts 29 extend upwardly into the housing 26 (see FIG. 5B) where they have angled intermediate sections 91 bending away from the central plane 80. The contacts 29 bend inwardly and downwardly back towards the central plane 80 15 forming a first bight 200. The first bight 200, in the embodiment shown, has a bend of about 158 degrees. However, any suitable degree of bend could be used. The first bight generally has a radius of curvature of between about 0.033 to about 0.043 inches. As the contacts approach the central plane 80 they are bent to form a second bight 202 forming a second lower contact area 97 for making mechanical as well as electrical contact with the lower traces 19 of the daughter printed circuit board 14. The contacts 29 then proceed downwardly and have ends 212 positioned against support bar 72 and are pre-stressed thereby. However, in an alternate embodiment of the invention, the ends need not extend down to the support bar 72. At a second pre-stress area 204 of the lower contacts 29, the contacts 29 are effectively spring loaded within the housing against extended shelves 65 limiting the movement of opposing lower contacts 29 towards each other. The individual lower contacts are each received in an individual aperture 68 defined by the side walls 46, shelves 65 and spacer bars 66. The spacer bars 66 can also constrain lateral movement of the lower contacts 29.

Figure 9:
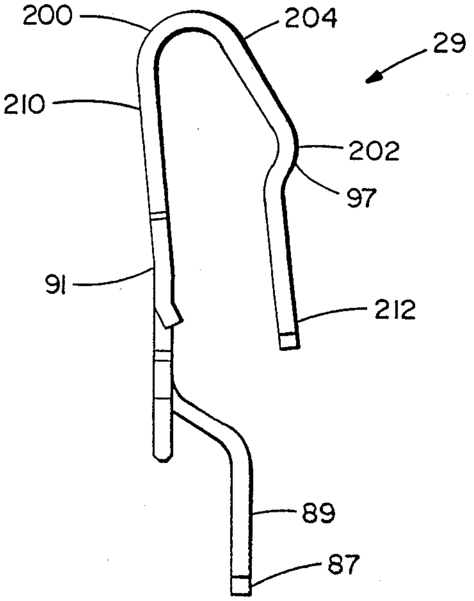
FIG. 9 is a side elevational view of one of the lower contacts shown in the connector of FIGS. 1 through 6.
Figure 10:
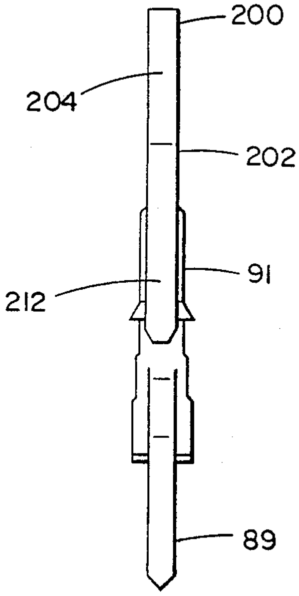
FIG. 10 is a front elevational view of the contact shown in FIG. 9.

The proper contact stress for the lower contacts 29 is provided by a combination of a crown on the contact area 97 with a radius of curvature as seen in FIG. 11 and the curve on the contact area 97 at the second bight 202 with a radius of curvature as seen in FIG. 9, the contact area 97 being the location where the lower traces 19 from the new type of daughter printed circuit boards rest when inserted. The second bight, in the embodiment shown, generally has a radius of curvature of between about 0.036 to about 0.040 inches. The crown is formed by coining and bending the contact strips in the contact area. The radius then has a plating placed on it such as a gold. The crown and the radius jointly provide a combination of two radii which produce the proper stress when the contact is placed on the traces 19 of the daughter printed circuit board 14. The gold is used on the contact primarily for lubrication.

Figure 12A:
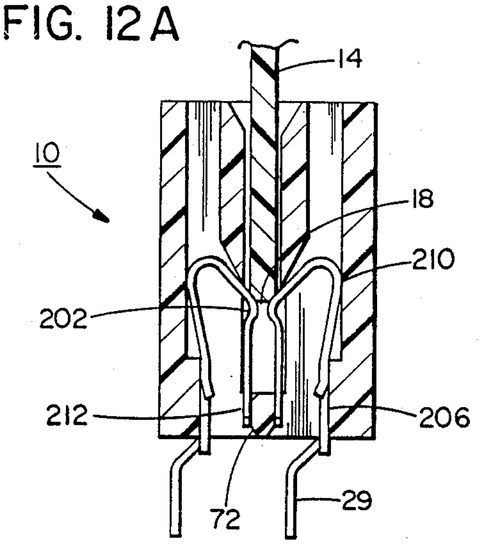
FIG. 12A is a sectional view of the connector as shown in FIG. 5B with a daughter printed circuit board partially inserted into the connector.
Figure 12B:
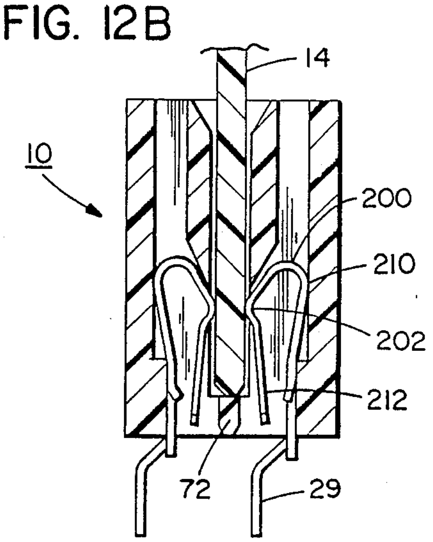
FIG. 12B is a sectional view of the connector as shown in FIG. 12A with the daughter printed circuit board fully inserted into the connector.

As mentioned above, the lower contacts 29 are pre-stressed behind the shelves 65 and support bar 72. The lower contacts are further stressed when a new type of daughter printed circuit board 14 is inserted so that the pre-stress area 204 of the contacts 29 move off of the shelves 65 thereby placing the proper amount of stress on the lower traces 16 of the daughter printed circuit board. However, the lower contacts 29 are provided such that they have a stepped or varied application of stress between the contacts 29 and the lower contact traces 19. As shown in FIG. 5B, when the lower contacts 29 are in a home position with no daughter printed circuit board inserted into the connector, the back 210 of the contacts 29 proximate the first bight 200 are spaced from the side walls 46. Referring now to FIGS. 12A and 12B, there are shown schematic views of the daughter printed circuit board 14 being inserted with the lower contacts 29 and into a final connection position, respectively. As shown in FIG. 12A, when the daughter printed circuit board makes contact with the contact area 97, the contacts 29 deflect back towards the side walls 46 with the back 210 of the contacts proximate the first bight 200 making contact with the side walls 46. This first deflection of the contacts 29 has a first spring rate because the contact is able to deform along substantially all of the contact above the portion 206 fixedly held in the housing 26. Once the backs of the contacts 29 contact the side walls 46 a second deflection occurs with a second spring rate of the contacts 29. The second spring rate is greater than the first spring rate because the contacts 29 can only deform in the area of the contact between the first and second bights. The second spring rate comes into effect just before the leading edge of the daughter printed circuit board 14 passes between the contact portions 97 at the second bights 202. When the daughter printed circuit board 14 is fully inserted into the connector as shown in FIG. 12B, the lower contacts 29 place the proper amount of stress of about 150,000 psi, plus or minus 50,000 psi, on the lower traces 16 of the printed circuit board.

The dual spring rate of the lower contacts 29 is generally provided to allow for proper insertion of the daughter printed circuit board into the connector without the inserter having to use excess force, but which nonetheless prevents the circuit board from being inadvertently removed from the connector and provides a proper electrical contact. Thus, the dual step deflection of the lower contacts is especially desired in view of the fact that the upper contacts 28 are already placing a stress of about 150,000 psi on the printed circuit board even before the leading edge of the daughter printed circuit board makes contact with the lower contacts 29.

The cross-sectional configuration of each contact is essentially rectangular at any point along its length except in the contact zones 96 and 97 where an electrical contact is made with the traces 16 of the daughter printed circuit board. In this zone, the opposed radially exterior faces 102 of each contact assume a convex configuration (note FIG. 11). This configuration is achieved through coining the contacts in this region rather than simply stamping them as had been the custom of the trade. The cross section has approximately parallel side edges 104 and a perpendicular radially interior face 106. The bowed exterior face 102 extends outwardly from the edges 104.

The individual contacts are fabricated of any conventional spring material such as metal, preferably phosphor bronze. Each contact is plated with nickel to a thickness of about between 0.000050 and 0.000150 inches. The solder tails are coated with solder of about 60 parts tin and 40 parts lead to a thickness of about between 0.000100 and 0.000500 inches. In the contact area a coating of gold at about 0.000004 inches nominally is plated over about 0.000040 inches minimum of about 80 parts palladium and 20 parts nickel. All of the platings include the plating of all surfaces or sides except in the contact area wherein the plating need only occur on that surface to contact the daughter printed circuit board.

The individual contacts are about 0.024 to 0.026 inches in width 108 being received at the lower part of the housing in apertures 76 of about 0.033 and 0.034 inches with the upper apertures 68 being about between 0.028 and 0.032 inches. The individual contacts are of a constant rectangular thickness 110 with a maximum total height 112, a rise of 114 and a radius of curvature 116.

During the coining process, the width of the strip metal is increased from about 0.018 to about 0.022 inches. However, the overall height is generally not changed and the overall height after coining is essentially or approximately the same as prior to coining.

The use of a concentrated contact area is desired because it produces a higher contact stress by reducing the area which contacts the trace. This stress is needed to break through any surface film or other debris that may be on the pad. The stress required is approximately 150,000 psi plus or minus 50,000 psi.

Creating a concentrated contact area in this fashion has in the past proved to be very difficult to do in a precisely controlled manner. If a spherical dimple is put on the contact leg first, then the subsequent bending of the leg will cause distortion in the contact area. Such distortion eliminates any control over the shape of the contact area and places on the surface an orange peel effect which is not as smooth as required. On the other hand, if the bend is put in first, then it is hard to make certain that a spherical dimple ends up at the intended location. It would thus be difficult to have the spherical dimple aligned in the center of the contact. When employing other than the method of the present invention, the spherical area may be so far out of center that it interferes with, and breaks through, the edge of the contact. These problems are amplified in connectors where the contacts are on the miniaturized 0.050 center lines as disclosed herein.

The solution to the problem is to place the high stress configuration on the contact by forming the bend in the contact and coining during manufacturing, resulting in the desired compound surface.

The method of fabricating the electrical contact thus comprises the steps of initially providing an elongated strip of electrically conductive material stamped from a sheet with a lower portion and an upper portion. The strip is then deformed by coining at an intermediate contact area between the lower and upper portions. The strip is bent at the intermediate contact area to form a bight with a radially interior face and a radially exterior face. The coined area is on the radially exterior face of the bent strip for contacting a trace 16 of the daughter board to be electrically coupled with the contact.

Figure 13:
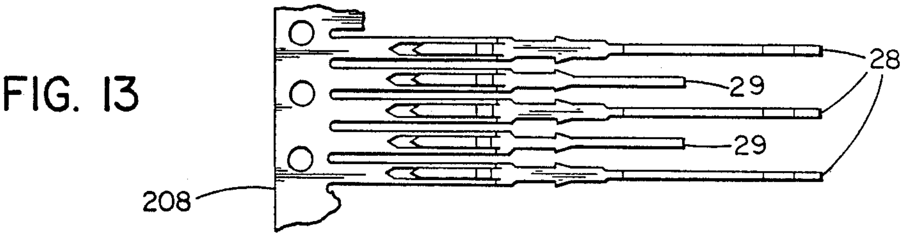
FIG. 13 is a plan view of a portion of a contact strip having alternating upper and lower contacts thereon.
Figure 14:
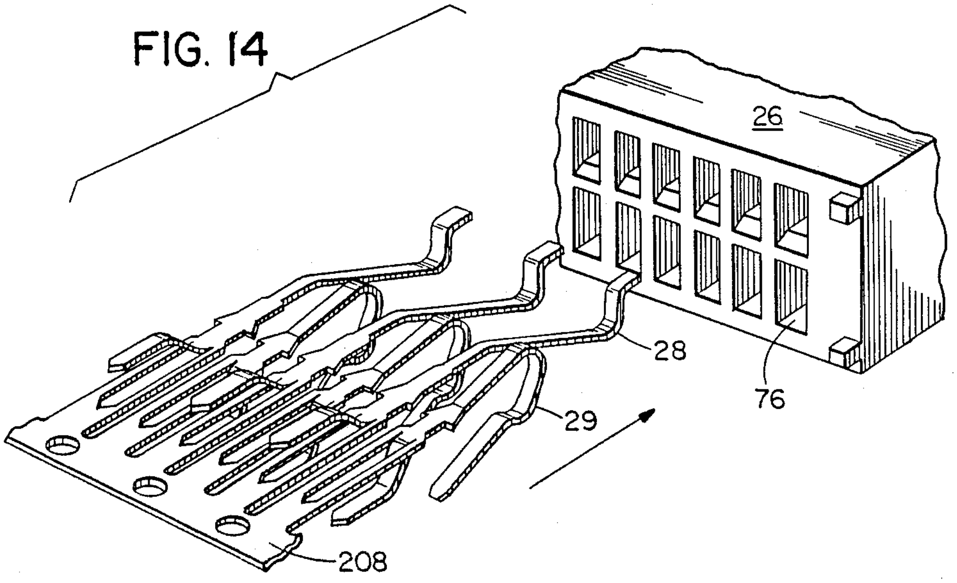
FIG. 14 is a partial perspective view of the contact strip of FIG. 13 having its upper and lower contacts inserted into a connector housing. Similar reference characters refer to similar parts throughout the several drawings.

Referring to FIGS. 13 and 14, the method of fabricating the electrical contacts 28 and 29 and the bi-level connector 10 will be described. The method of fabricating the electrical contacts comprises the steps of initially providing an elongate strip of electrically conductive material stamped from a sheet with a lower portion, an upper portion and intermediate contact portions. The strip is then deformed by coining the intermediate contact portions at specific locations on alternating contact portions. The upper portion is then removed and the strip is bent at the intermediate contact portions by a progressive die process to form the individual upper contacts 28 and lower contacts 29 connected by the lower portion which forms a carry strip 208 provided with both upper and lower contacts 28 and 29 in alternating fashion. As shown in FIG. 14, both the upper and lower contacts can be inserted into a row of a housing 26 in a single operation and the carry strip 208 is then simply removed. This single operation or insertion process saves time and money in the manufacture of bi-level connectors rather than having to separately insert lower contacts and then separately having to insert upper contacts.

The method further includes the step of fabricating the contacts of phosphor bronze and plating the strip with nickel to a thickness of about between 0.000050 and 0.000150 inches. The method further includes the step of plating the lower portion of the contact with solder of about 60 percent tin and 40 percent lead to a thickness of about between 0.000100 and 0.000500 inches to ensure a proper soldering contact with the mother board. Lastly, the contact area of the contact is plated with about 40 microinches or thicker PdNi flashed with gold to a thickness of about 0.000004 inches nominally. Alternatively, the area can be plated with about 30 microinches or thicker gold.

The present disclosure includes that information contained in the appended claims as well as that in the foregoing description. Although the invention has been described in its preferred form or embodiment with a certain degree of particularity, it is understood that the present disclosure of the preferred form has been made only by way of example and that numerous changes in the details of construction, fabrication and use, including the combination and arrangement of parts, may be resorted to without departing from the spirit and scope of the invention.

What is claimed is:

1. An electrical connector for mechanically and electrically connecting a mother printed circuit board and a removable daughter printed circuit board of the edge card type, the connector comprising:

housing means comprising an electrically insulating material and having at least two rows of contact chambers therein and a daughter printed circuit board receiving area;

first contact means comprising a plurality of a first type of electrically conductive contacts; and second contact means comprising a plurality of a second type of electrically conductive contacts, said first and second types of contacts being alternatingly positioned in each of said rows, said second type of contacts each comprising:

(a) a first portion formed as a solder tail positionable to extend from said housing for coupling with a mother printed circuit board;

(b) a second portion extending into said housing means from said first portion and having an angled portion therewith;

(c) a third portion comprising a first bight with an outer face on a first side of said second type of contact; and (d) a fourth portion extending from said third portion and forming a second bight with an outer face on said first side of said second type of contact for contacting and supporting a received daughter printed circuit board, wherein each of said second type of contacts are capable of having at least three positions in said housing means dependent upon the position of a daughter printed circuit board relative to said second type of contacts, said at least three positions including a first position having said outer face of said first bight spatially separated from a wall in said contact chamber and said second bight being positioned in said daughter printed circuit board receiving area, a second position with said first bight being in contact with said wall and said second bight being in said daughter printed circuit board receiving area, and a third position with said first bight being in contact with said wall and said second bight being displaced from a path of an inserted printed circuit board in said receiving area.

2. A connector as set forth in claim 1 wherein said second type of contacts are fabricated of phosphor bronze.

3. A connector as in claim 1 wherein said second contact fourth portions each comprise a compound radii comprised of said second bight and a crown on said outer face.

4. A connector as in claim 1 wherein said second contact first bights each has a radius of curvature of between about 0.033 to about 0.043 inches.

5. A connector as in claim 1 wherein said second contact second bights each has a radius of curvature of between about 0.036 to about 0.040 inches.

6. A connector as in claim 1 wherein each of said first bights produce a bend in said second contacts of about 158 degrees.

7. A connector as set forth in claim 1 wherein said second type of contacts each has a cross-sectional configuration which is generally rectangular except at said second bight whereat it has generally parallel side edges and a back face perpendicular with respect to said side edges and said outer face bows outwardly from said back face.

8. A connector as in claim 1 wherein said housing means comprises contact pre-stress means for said second type of contacts.

9. A connector as in claim 1 wherein upon insertion of a daughter printed circuit board into the connector said second type of contacts can each be displaced from the path of the daughter printed circuit board by first bending proximate said angled portion and said first bight and upon contact of said first bight outer face with said contact chamber wall bending proximate said first bight.

10. A connector as in claim 1 wherein said first type of contacts have solder tails aligned in rows parallel to said contact chamber rows and said second type of contacts each have their solder tail aligned in rows separate from but parallel to said first type of contacts solder tails.

11. A connector as in claim 1 wherein said first and second types of contacts are spaced apart in each row at a pitch of about 50 mils.

12. A connector as in claim 1 wherein said second type of contacts are spring contacts with a substantially stepped spring rate dependent upon the position of a daughter printed circuit board relative to said second type of contacts.

13. A connector as set forth in claim 2 wherein said second type of contacts are plated with nickel to a thickness of about between 0.000050 and 0.000150 inches.

14. A connector as set forth in claim 13 wherein said fourth portion outer faces are plated with about 30 microinches thick or thicker of gold.

15. A connector as set forth in claim 13 wherein said second bight outer faces are plated about 40 microinches or thicker PdNi flashed with gold to a thickness of about 0.000004 inches nominally.

16. A connector as set forth in claim 4 wherein said first portions are plated with solder of about 60 percent tin and 40 percent lead to a thickness of about between 0.000100 and 0.000500 inches.

17. An electrical connector for mechanically and electrically connecting a mother printed circuit board and a removable daughter printed circuit board of the edge card type, the connector comprising:

housing means of an electrically insulating material, said housing means having at least two rows of separate contact housing chambers, each of said housing chambers having a rear wall and an opposite contact aperture communicating with a central aperture of said housing means for receiving a daughter printed circuit board; and contact means comprising a plurality of a first type of electrically conductive spring contacts, each of said first type of contacts comprising a first portion formed as a solder tail positionable to extend from said housing for coupling with a mother printed circuit board, a contacting portion for contacting a daughter printed circuit board, said contacting portion being at least partially displaceable from a home position by the insertion of a daughter printed circuit board into the connector, and an intermediate portion therebetween; and means for varying the spring rate of each of said fist type of contact during insertion of a daughter printed circuit board into the connector at a predetermined position during the insertion, said means for varying the spring rate comprising said intermediate portion being spaced from said rear wall at a first position and being in contact with said rear wall in a second position such that said first type of contacts have a first spring rate at said first position and a second spring rate at said second position with a substantially stepped transition between said first and second spring rates upon the movement of said intermediate portion to said second position.

18. A connector as in claim 17 wherein said contact means comprises a second type of electrically conductive contacts alternatingly intermixed with said first type of contacts in said rows.

19. A connector as in claim 17 wherein said means for varying the spring rate comprises said first type of contacts each having at least two different spring rates during the insertion, a first relatively low spring rate and a second relatively high spring rate.

20. An electrical connector for mechanically and electrically connecting a mother printed circuit board and a removable daughter printed circuit board of the edge card type, the connector comprising:

housing means comprising an electrically insulating material having at least one row of contact members therein and a daughter printed circuit board receiving area;

first contact means comprising a plurality of a first type of electrically conductive contacts, each first type of contact comprising:

(a) a first portion formed as a solder tail positionable to extend from said housing for coupling with a mother printed circuit board;

(b) a second portion extending onto said housing means, said second portion having a first section relatively fixedly connected to said housing means and a second section extending into one of said contact chambers and having a first side spatially separated from a wall in a said housing means;

(c) a third portion extending from said second portion and comprising a first bight with an outer face on said first side of said first type of contact, said outer face of said first bight being spatially separated from said wall in a home position; and (d) a fourth portion extending from said third portion and forming a second bight with an outer face on said first side of said contact for contacting and supporting a received daughter printed circuit board;

wherein said first type of contacts and said housing means can cooperate to provide means for varying the amount of force exerted against a daughter printed circuit board being inserted, said means for varying the amount of force comprising said second portion second section being deformable as a daughter printed circuit board is being inserted into said daughter printed circuit board receiving area pressing against said fourth portion such that said first bight can move into contact with said wall with said second portion second section remaining spatially separated from said wall whereby said contacts can exert a first relatively uniform force against a daughter printed circuit board while said first bight is spatially separated from said wall and a second relatively uniform force can be exerted against a daughter printed circuit board when said first bight is in contact with said wall.

21. An electrical connector for mechanically and electrically connecting a mother printed circuit board and a removable daughter printed circuit board of the edge card type, the connector comprising:

housing means of an electrically insulating material, said housing means having at least one row of separate contact housing chambers, each of said housing chambers having a relatively stationary rear wall and an opposite contact aperture communicating with a central aperture of said housing means for receiving a daughter printed circuit board; and contact means comprising a plurality of a first type of electrically conductive spring contacts, each of said first type of contacts comprising a first portion formed as solder tail positionable to extend from said housing for coupling with a mother printed circuit board, a contacting portion being at least partially displaceable from a home position by the insertion of a daughter printed circuit board into the connector, and an intermediate portion therebetween, said intermediate portion having a first section spatially separated from said rear wall and a second section comprising a first bight spatially separated from said rear wall in a home position, said first bight being located at an uppermost portion of first type of contacts; and means for varying the amount of force exerted against a daughter printed circuit board during insertion into the connector, said means for varying the force comprising said first bight of each first type of contact being spaced from said rear wall at said home position and being in contact with said rear wall in a second position and said intermediate portion second section being continuously spatially separated from said rear wall such that movement of said first type of contact caused by insertion of a daughter printed circuit board can deform said first type of contact in said contact chamber and upon contact of said first bight with said rear wall said intermediate section second section is substantially prevented from additional deformation to thereby increase the force exerted against a daughter printed circuit board being inserted by substantially limiting further deformation of said first type of contact to said intermediate portion first section and said contacting portion.

22. A connector as in claim 21 further comprising means for prestressing said first type of contacts in said housing means comprising portions of each of said first type of contacts located both above and below said contacting portion being in contact with portions of said housing means in said home position.

* * * * *